US009178491B2

(12) United States Patent
Takemura

(10) Patent No.: US 9,178,491 B2
(45) Date of Patent: Nov. 3, 2015

(54) CIRCUIT MODULE INCLUDING DUPLEXER

(71) Applicant: Murata Manufacturing Co., Ltd., Nagaokakyo-shi, Kyoto-fu (JP)

(72) Inventor: Tadaji Takemura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 2 days.

(21) Appl. No.: 14/146,740

(22) Filed: Jan. 3, 2014

(65) Prior Publication Data
US 2014/0118084 A1  May 1, 2014

Related U.S. Application Data

(63) Continuation of application No. PCT/JP2012/004400, filed on Jul. 6, 2012.

(30) Foreign Application Priority Data

Jul. 8, 2011 (JP) ................. 2011-152162

(51) Int. Cl.
*H03H 9/70* (2006.01)
*H03H 9/72* (2006.01)
*H03H 9/10* (2006.01)
*H03H 9/05* (2006.01)

(52) U.S. Cl.
CPC ............. *H03H 9/706* (2013.01); *H03H 9/0576* (2013.01); *H03H 9/1092* (2013.01); *H03H 9/725* (2013.01)

(58) Field of Classification Search
CPC ... H03H 7/463; H03H 9/0538; H03H 9/0547; H03H 9/0557; H03H 9/0566; H03H 9/0571; H03H 9/0576; H03H 9/105; H03H 9/1092; H03H 9/706; H03H 9/725

USPC .......................................... 333/133
See application file for complete search history.

(56) References Cited

U.S. PATENT DOCUMENTS

| 4,944,432 A | 7/1990 | Jouillat | |
|---|---|---|---|
| 7,187,945 B2 * | 3/2007 | Ranta et al. | ............. 455/552.1 |

(Continued)

FOREIGN PATENT DOCUMENTS

| DE | 102 28 328 A1 | 1/2004 |
|---|---|---|
| DE | 10 2005 026 243 A1 | 12/2006 |

(Continued)

OTHER PUBLICATIONS

English language machine translation of JP 2009-10121, published Jan. 15, 2009.*

(Continued)

*Primary Examiner* — Barbara Summons
(74) *Attorney, Agent, or Firm* — Keating & Bennett, LLP

(57) ABSTRACT

A circuit module includes a duplexer mounted on a module board and a cover layer is stacked on an insulating layer that is disposed on one principal surface of a device board so as to enclose a predetermined area thereof. A transmission filter device and a reception filter device that have different transmission bands are provided on the one principal surface of the device board in the predetermined area thereof within the space enclosed by the insulating layer between the device board and the cover layer. Accordingly, the duplexer does not include a package board as in the existing technique, and in turn a circuit module including the duplexer mounted on the module board is significantly reduced in height and in size.

20 Claims, 3 Drawing Sheets

(56) References Cited

U.S. PATENT DOCUMENTS

| | | | |
|---|---|---|---|
| 7,289,008 B2 * | 10/2007 | Kuroki et al. | 333/133 |
| 7,352,105 B2 * | 4/2008 | Mori et al. | 310/313 R |
| 7,403,082 B2 * | 7/2008 | Kearns | 333/126 |
| 7,420,438 B2 * | 9/2008 | Nakai et al. | 333/133 |
| 2005/0070332 A1 | 3/2005 | Yamato | |
| 2005/0230812 A1 | 10/2005 | Przadka | |
| 2008/0266023 A1 | 10/2008 | Tanaka | |
| 2009/0224851 A1 | 9/2009 | Feiertag et al. | |
| 2009/0309673 A1 | 12/2009 | Iwamoto | |

FOREIGN PATENT DOCUMENTS

| | | | |
|---|---|---|---|
| JP | 02-063568 A | | 3/1990 |
| JP | 8-191230 | * | 7/1996 |
| JP | 2003-283284 A | | 10/2003 |
| JP | 2004-32616 | * | 1/2004 |
| JP | 2006-279604 A | | 10/2006 |
| JP | 2007-142812 | * | 6/2007 |
| JP | 2009-10121 | * | 1/2009 |
| JP | 2009-247014 A | | 10/2009 |
| JP | 2010-193487 A | | 9/2010 |
| WO | 2006/085465 A1 | | 8/2006 |
| WO | 2008/105199 A1 | | 9/2008 |

OTHER PUBLICATIONS

English language machine translation of JP 2010-193487, published Sep. 2, 2010.*
Official Communication issued in International Patent Application No. PCT/JP2012/004400, mailed on Sep. 25, 2012.
Official Communication issued in corresponding German Patent Application No. 11 2012 002 879.1, mailed on May 5, 2014.

* cited by examiner

CIRCUIT MODULE INCLUDING DUPLEXER

BACKGROUND OF THE INVENTION

1. Field of the Invention

The present invention relates to circuit modules that include duplexers including a first filter device and a second filter device that have different transmission bands.

2. Description of the Related Art

In recent years, portable communication terminals such as a cellular phone and a portable information terminal which support communication through a plurality of communication standards such as the GSM (Global System for Mobile Communications) standard and the CDMA (Code Division Multiple Access) standard have rapidly become widespread. In these portable communication terminals, signals in different frequency bands are transmitted and received using a common antenna. There is thus an increasing demand for improvement in performance and reduction in the size of front end modules (circuit modules) such as an antenna switch including a duplexer that separates a transmission signal and a reception signal having different frequencies.

For example, as illustrated in FIG. 6, a duplexer 500 having a reduced size and improved performance achieved by disposing first and second filter units 503 and 505 having different signal transmission bands in close proximity to each other so that the characteristics of each of the filter units 503 and 505 do not degrade, is mounted on a module board included in a circuit module, and thus the circuit module has a reduced size and improved performance.

The existing duplexer 500 illustrated in FIG. 6 has a packaging structure and includes a package board 501, the first filter unit 503, and the second filter unit 505. The package board 501 is formed of a resin, ceramic, or polymer material and is formed by a print board, an LTCC board, an alumina-based board, a glass board, a composite material board, or the like, and the first filter unit 503 and the second filter unit 505 are provided on a component side of the package board 501. In addition, the first and second filter units 503 and 505 are provided with SAW (surface acoustic wave) filter devices 502 and 504, respectively, and are each provided with passive devices, namely chip inductors 506 and a chip capacitor 507, which serve as peripheral circuit devices for complementing the electrical characteristics of the SAW filter devices 502 and 504.

Each of the SAW filter devices 502 and 504 mounted in the duplexer 500 illustrated in FIG. 6 includes a device board, an airtight sealing frame, and a base board (cover layer). The device board is formed of a piezoelectric material, and interdigital electrodes are provided on one principal surface of the device board in a predetermined area thereof; the airtight sealing frame is arranged on the device board so as to enclose the predetermined area thereof in which the interdigital electrodes are provided; and the base board is placed over the one principal surface with the airtight sealing frame provided therebetween. The interdigital electrodes are thus enclosed within an airtight space that is formed between the device board and the base board and is enclosed by the airtight sealing frame. With this configuration, the interdigital electrodes (piezoelectric material) disposed within the airtight space are excited appropriately. Thus, a surface acoustic wave generated as a signal is inputted propagates along the surface of the device board, and degradation of the interdigital electrodes disposed within the airtight space is prevented.

Furthermore, in order to suppress electromagnetic interference between the inductor devices and to prevent signal interference between the filter units 503 and 505, the chip inductors 506 that are disposed adjacent to each other in a boundary portion 508 between the first filter unit 503 and the second filter unit 505 are disposed on the package board 501 such that the directions of the magnetic fluxes thereof are orthogonal to each other. With this configuration, even when the filter units 503 and 505 are disposed in close proximity to each other, signal interference between the first and second filter units 503 and 505 is prevented, and thus variations in the characteristics of the filter units 503 and 505 are reduced.

In this manner, the existing duplexer 500, which has been reduced in size and improved in performance, is mounted on the module board, and the first and second filter units 503 and 505 of the duplexer 500 are used as a transmission filter and a reception filter, respectively. Thus, the circuit module such as an antenna switch is formed.

In recent years, portable communication terminals have rapidly been decreasing in size, and there has been a demand for further reducing the height and the size of a circuit module to be mounted in a portable communication terminal, leading to an increasing demand for improvement in technology.

SUMMARY OF THE INVENTION

In view of the above, preferred embodiments of the present invention provide a technique that makes it possible to further reduce the height and the size of a circuit module that includes a duplexer.

A circuit module according to a preferred embodiment of the present invention includes a device board, an insulating layer disposed on one principal surface of the device board so as to enclose a predetermined area thereof, a cover layer stacked on the insulating layer so as to provide a space enclosed by the insulating layer between the cover layer and the device board, a duplexer including a first filter device and a second filter device that have different transmission bands and are provided in the predetermined area within the space, a module board on which the duplexer is mounted, a first circuit element provided in the cover layer and connected to the first filter device or the second filter device, and a second circuit element provided on the module board and connected to the first filter device or the second filter device.

The second circuit element may be a chip component mounted on a component side of the module board. With this structure, the circuit element having a large resistance value, a large inductance value, a large capacitance value, and so on is provided on the circuit module with ease.

It is preferable that the second circuit element include a circuit pattern provided on the module board and that the chip component and the circuit pattern be disposed so as to overlap when viewed from above. With this structure, by combining the chip component and the circuit pattern, the chip component is reduced in size. In addition, disposing the chip component and the circuit pattern so as to overlap when viewed from above makes it possible to reduce the area on the circuit module which is occupied by the second circuit element, and thus the circuit module is reduced in size.

The second circuit element may include a circuit pattern provided on the module board. With this structure, a circuit element such as the chip component does not need to be mounted on the module board, and thus the circuit module is reduced in size.

The duplexer and the circuit pattern may be disposed so as to overlap when viewed from above. With this structure, the second circuit element can be disposed underneath the mounting location of the duplexer to reduce the module board in size, and thus the circuit module is reduced in size.

It is preferable that a shield electrode that is provided between the duplexer and the second circuit element be provided on the module board. With this structure, the second circuit element and the first circuit element or the first or second filter device is prevented from experiencing magnetic field coupling or capacitive coupling and from thus interfering with each other.

The first and second circuit elements may be disposed so as not to overlap when viewed from above. With this structure, the first and second circuit elements are prevented from experiencing magnetic field coupling or capacitive coupling and from thus interfering with each other.

The first and second circuit elements may be disposed immediately underneath the first filter device and connected to the first filter device. With this structure, a signal that propagates through the first filter device is prevented from leaking into the second filter device, and thus isolation characteristics of the first and second filter devices are improved.

The first circuit element may include a circuit pattern formed in the cover layer. With this structure, the duplexer does not increase in height as the first circuit element is provided in the cover layer, and such a configuration is practical.

The device board may be made of a piezoelectric material; the first and second filter devices may be SAW filter devices that each include an interdigital electrode provided in the predetermined area; and the first circuit element may be a resonator including a coil that adjusts attenuation characteristics of a filter and may be connected to the first or second filter device. With this structure, the attenuation characteristics of the first or second filter device are improved.

The second circuit element may define a matching circuit, and the second circuit element may be connected to an input side or an output side of each of the first and second filter devices. With this structure, the second circuit element can be formed with ease by, for example, a coil having a large inductance value, and such a configuration is very practical and efficient.

According to various preferred embodiments of the present invention, the first filter device and the second filter device, which have different transmission bands, are provided on the device board in the predetermined area thereof within the space enclosed by the insulating layer between the device board and the cover layer. Thus, the duplexer does not include a package board as in the existing technique, and in turn the circuit module including the duplexer mounted on the module board is further reduced in height and in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
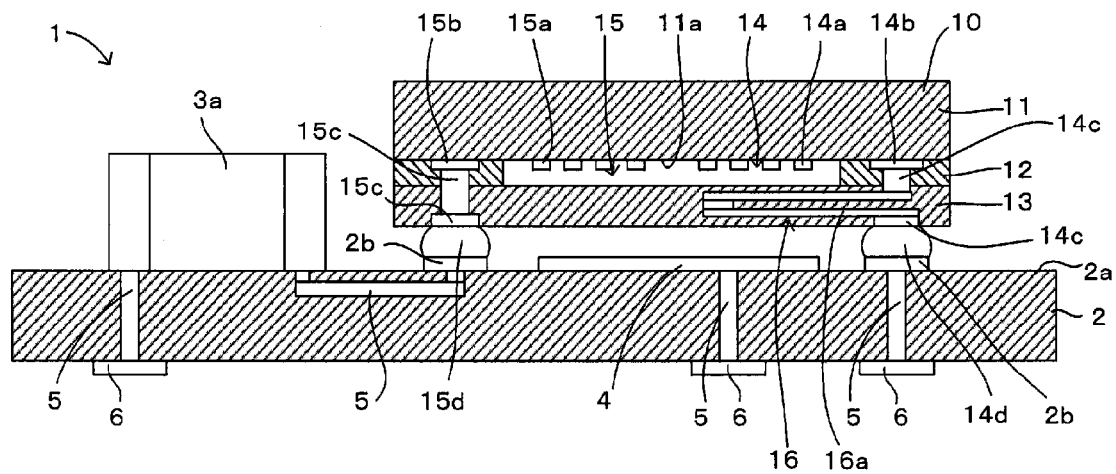
FIG. 1 is a diagram illustrating a first preferred embodiment of a circuit module of the present invention.
Figure 2:
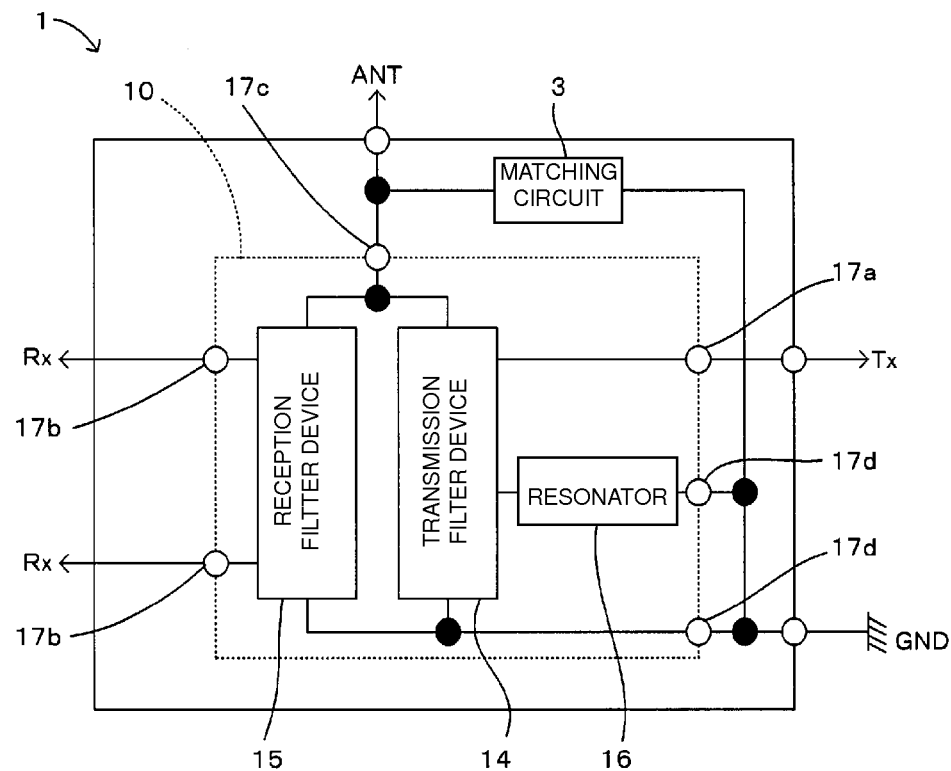
FIG. 2 is a block diagram illustrating an internal configuration of the circuit module illustrated in FIG. 1.
Figure 3:
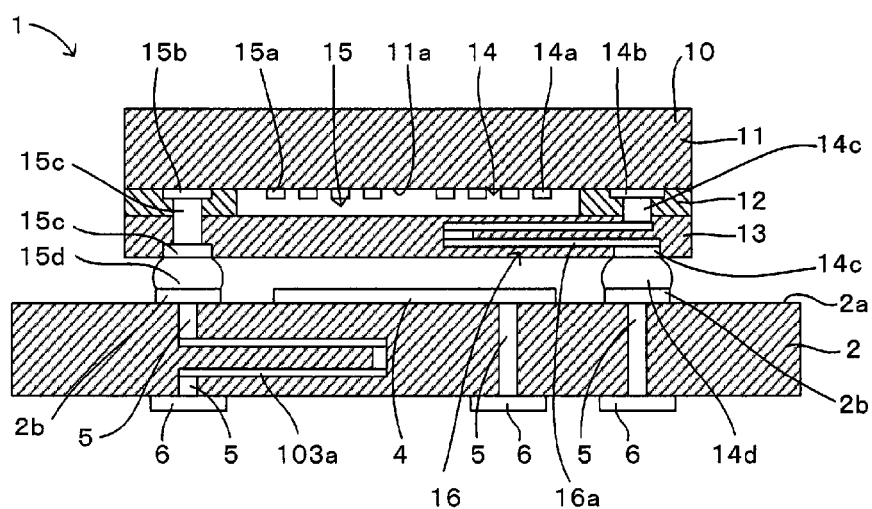
FIG. 3 is a diagram illustrating a second preferred embodiment of a circuit module of the present invention.
Figure 4:
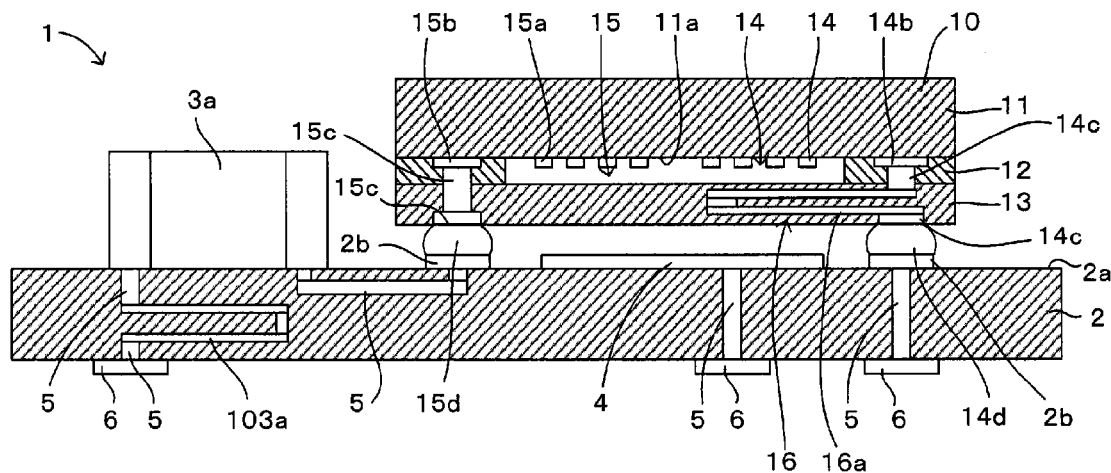
FIG. 4 is a diagram illustrating a third preferred embodiment of a circuit module of the present invention.
Figure 5:
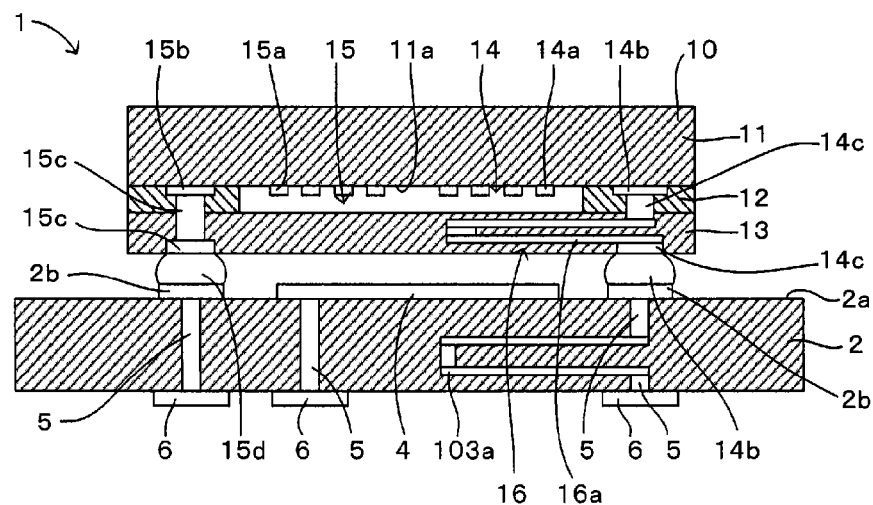
FIG. 5 is a diagram illustrating a fourth preferred embodiment of a circuit module of the present invention.
Figure 6:
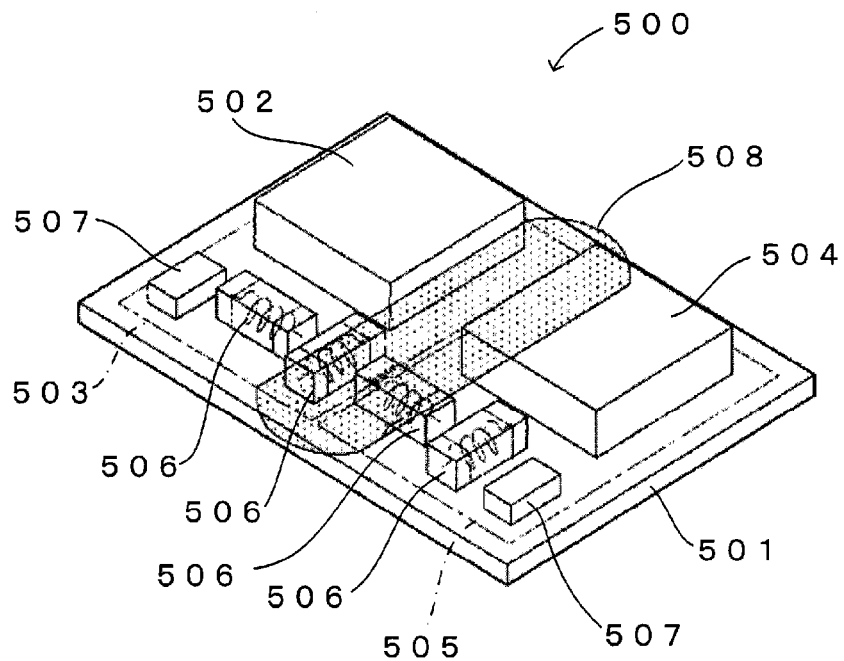
FIG. 6 is a diagram illustrating an example of an existing circuit module.

A first preferred embodiment of a circuit module that includes a duplexer of the present invention will be described with reference to FIG. 1 and FIG. 2. FIG. 1 is a diagram illustrating the first preferred embodiment of the circuit module that includes the duplexer of the present invention. FIG. 2 is a block diagram illustrating the internal configuration of the circuit module illustrated in FIG. 1. FIG. 1 and FIG. 2 illustrate only principal configurations pertaining to the first preferred embodiment of the present invention, and other configurations are omitted therein. In addition, FIG. 3 to FIG. 5 illustrating second to fourth preferred embodiments, which will be described later, illustrate only principal configurations, similarly to FIG. 1, and thus description thereof will be omitted below.

A circuit module 1 illustrated in FIG. 1 and FIG. 2 is mounted on a motherboard included in a portable communication terminal such as a cellular phone and a portable information terminal, for example. In the first preferred embodiment, the circuit module 1 includes a duplexer 10 that includes a transmission filter device 14 and a reception filter device 15, a module board 2, a matching circuit 3, a shield electrode 4, and various other components (not illustrated) such as a switch IC, a filter, a resistor, a capacitor, and a coil, and is preferably included in a high frequency antenna switch module.

Components such as the duplexer 10 and a chip coil 3a are mounted on electrodes 2b that are provided on a component side 2a of the module board 2 and are electrically connected, through internal wiring patterns 5 provided in the module board 2, to a plurality of mounting electrodes 6, which are located on a rear side of the module board 2. As the circuit module 1 is mounted on the motherboard, the circuit module 1 is connected to various signal lines and power supply lines such as an antenna line ANT, a ground line GND, a transmission signal line Tx, and a reception signal line Rx included in the motherboard, allowing input and output of transmission and reception signals between the motherboard and the circuit module 1.

In the first preferred embodiment, the module board 2 preferably is an integrated ceramic multilayer body including multiple dielectric layers, each including a ceramic green sheet, which are stacked on each other and then fired. A ceramic green sheet defining each dielectric layer preferably is obtained as a slurry, in which a mixed powder of alumina, glass, and so on is mixed with an organic binder, a solvent, and so on, is formed into a sheet with a molder, and such a sheet is formed so that the sheet can be fired at a low temperature of approximately around 1000° C., or in other words, the sheet can undergo low-temperature firing. A via hole is then formed in the ceramic green sheet that has been cut out into a predetermined shape through laser processing or the like. The formed via hole is then filled with a conductive paste containing Ag, Cu, and the like, or is subjected to via fill plating, and thus an interlayer connection via conductor is formed. Various electrode patterns are formed through printing with the conductive paste, and each dielectric layer is thus formed.

As the via conductor and the electrode patterns are formed as appropriate in each dielectric layer, the wiring patterns 5, which interconnect the duplexer 10 with components such as the chip coil 3a mounted on the module board 2, the shield electrode 4, the mounting electrodes 6, and so on are formed in the module board 2. In other words, as the electrode patterns and the via conductor are provided as appropriate in each dielectric layer to form the shield electrode 4, the wiring patterns 5, the mounting electrodes 6, and so on, the components such as the duplexer 10 and the chip coil 3a mounted on the module board 2 are electrically interconnected with the mounting electrodes 6. Here, as described later, circuit elements such as a capacitor and a coil may be formed by the electrode patterns and the via conductor formed in each dielectric layer, and a filter circuit, the matching circuit 3, and so on may be formed by the formed circuit elements such as the capacitor and the coil.

The matching circuit 3 is preferably defined by the chip coil 3a (corresponding to a "second circuit element" of a preferred embodiment of the present invention), which is a chip component mounted on the component side 2a of the module board 2, and is connected to an output side of the transmission filter device 14 and an input side of the reception filter device 15 through a common terminal 17c of the duplexer 10.

The shield electrode 4 is provided on the component side 2a of the module board 2 and is electrically connected to the ground line GND.

The duplexer 10 preferably has a wafer level chip size package (WL-CSP) structure and includes a device board 11, an insulating layer 12, a cover layer 13, the transmission filter device 14, the reception filter device 15, and a resonator 16. The transmission filter device 14 and the reception filter device 15 have different high frequency signal transmission bands, and the resonator 16 is provided in the cover layer 13.

In the first preferred embodiment, the device board 11 preferably is made of a piezoelectric material such as lithium niobate, lithium tantalate, and crystal. Interdigital electrodes 14a and 15a (IDT electrodes) that are preferably made of Al, Cu, or the like are provided on one principal surface 11a of the device board 11 in a predetermined area thereof to define SAW (surface acoustic wave) filter devices. The SAW filter devices that are defined by the interdigital electrodes 14a and 15a, respectively, define the transmission filter device 14 (corresponding to a "first filter device" of a preferred embodiment of the present invention) and the reception filter device 15 (corresponding to a "second filter device" of a preferred embodiment of the present invention).

The duplexer 10 is provided with a transmission terminal 17a, reception terminals 17b, the common terminal 17c (antenna terminal), and ground terminals 17d. The transmission terminal 17a is connected to an input side of the transmission filter device 14; the reception terminals 17b are connected to an output side of the reception filter device 15; and the common terminal 17c is connected to the output side of the transmission filter device 14 and the input side of the reception filter device 15. In the first preferred embodiment, the reception filter device 15 includes a balanced output type reception filter.

Terminal electrodes 14b and 15b are provided on the one principal surface 11a of the device board 11. The terminal electrode 14b is connected to the interdigital electrode 14a that defines the transmission filter device 14, and the terminal electrode 15b is connected to the interdigital electrode 15a that defines the reception filter device 15.

The insulating layer 12 is arranged on the one principal surface 11a of the device board 11 so as to enclose the predetermined area thereof in which the interdigital electrodes 14a and 15a are provided. The insulating layer 12 is preferably formed through the following example processes. A resin layer is formed on the one principal surface 11a of the device board 11, on which the interdigital electrodes 14a and 15a and the terminal electrodes 14b and 15b are formed, using photosensitive epoxy-based resin or polyimide-based resin. The resulting product is then subjected to a photolithography process. Thereafter, the resin layer formed in the predetermined area in which the interdigital electrodes 14a and 15a are formed and the resin layer formed in the area where the terminal electrodes 14b and 15b are located are removed.

The cover layer 13 is stacked on the insulating layer to provide and define a space enclosed by the insulating layer 12 between the cover layer 13 and the device board 11. The interdigital electrodes 14a and 15a (transmission filter device 14 and reception filter device 15) are disposed within the space thus provided and defined. The cover layer 13 is provided with the resonator 16 that includes a coil 16a defined by a circuit pattern provided in an inner layer of the cover layer 13. The resonator 16 is connected to the transmission filter device 14 defined by the SAW filter device, and an attenuation pole is formed accordingly. Thus, attenuation characteristics of the transmission filter device 14 are adjusted.

The cover layer 13 is preferably formed by repeating the following set of processes, for example. A resin layer formed of photosensitive epoxy-based resin or polyimide-based resin is stacked on the insulating layer 12, and an electrode pattern for forming the coil 16a is formed in the stacked resin layer. The resulting product is then subjected to a photolithography process in order to have connection holes formed in the resin layer. The connection holes are then filled with a Cu or Al paste or are subjected to via fill plating. Thus, electrodes 14c and 15c to be connected to the terminal electrodes 14b and 15b, respectively, are formed. Mounting solder balls 14d and 15d are then formed on the respective electrodes 14c and 15c that are connected to the respective connection terminals 14b and 15b and are exposed through the cover layer 13, and the duplexer 10 is thus formed.

In the first preferred embodiment, the transmission filter device 14 and the reception filter device 15 included in the duplexer 10 are preferably constituted by the SAW filter devices. Alternatively, the device board 11 may be formed, for example, of a Si board, and thus the transmission filter device 14 and the reception filter device 15 may be constituted of BAW filter devices.

Subsequently, an exemplary method for fabricating the circuit module 1 illustrated in FIG. 1 will be described in brief.

First, a via hole is formed in a ceramic green sheet, which has been shaped into a predetermined shape, by a laser or the like, and the via hole is filled with a conductive paste thereinside and is subjected to via fill plating in order to form an interlayer connection via conductor (wiring pattern 5). Then, the electrode patterns such as the mounting electrodes 2b on the component side 2a, the shield electrode 4, the land-shaped wiring patterns 5, and the mounting electrodes 6 are printed with the conductive paste, and thus a ceramic green sheet for forming each dielectric layer, which forms the module board 2, is prepared. Note that a plurality of via conductors and a plurality of electrode patterns preferably are provided on each ceramic green sheet so that a large number of module boards 2 are formed at the same time.

The dielectric layers are then stacked on each other to form a multilayer body. Then, grooves that divide the multilayer body into individual module boards 2 after firing are formed so as to surround the area corresponding to each module board 2. Thereafter, the multilayer body undergoes low-temperature firing, and thus an aggregate of the module boards 2 is formed.

Prior to dividing into the individual module boards 2, the component side 2a of the aggregate of the module boards 2 on which various components such as the duplexers 10 and the chip coils 3a are mounted is filled with mold resin, and the mold resin is then thermally cured. Thus, a mold layer (not illustrated) is provided on each of the module boards 2 to form an aggregate of the circuit modules 1. Thereafter, the aggregate of the circuit modules 1 is divided into individual circuit modules 1 to complete the circuit module 1.

In the circuit module 1 formed as described above, a transmission signal outputted from the transmission signal line Tx on the motherboard to the transmission terminal 17a of the duplexer 10 through the mounting electrodes 6 and the internal wiring patterns 5 is inputted to the transmission filter device 14, in which the transmission signal is subjected to predetermined filtering processing. The resulting transmission signal is then outputted to the module board 2 from the common terminal 17c and is outputted to the antenna line ANT on the motherboard through the internal wiring patterns 5 (matching circuit 3) and the mounting electrodes 6. In addition, a reception signal inputted to the common terminal 17c of the duplexer 10 from the antenna line ANT on the motherboard through the mounting electrodes 6 and the internal wiring patterns 5 (matching circuit 3) is inputted to the reception filter device 15, in which the reception signal is subjected to predetermined filtering processing. The resulting reception signal is then outputted to the module board 2 from the reception terminal 17b and is outputted to the reception signal line Rx on the motherboard through the internal wiring patterns 5 and the mounting electrodes 6.

A method for fabricating the circuit module 1 that includes the module board 2 provided with the internal wiring patterns 5 and the duplexer 10 having the WL-CSP structure is not limited to the method described above, and the circuit module 1 may be formed through a generally well-known fabrication method, for example. The module board 2 can be a print board, an LTCC, an alumina-based board, a glass board, a composite material board, a single-layer board, a multilayer board, or the like that is formed of a resin, ceramic, or a polymer material, and an optimal material may be selected as appropriate to form the module board 2 in accordance with the intended use of the circuit module 1, for example.

As described above, in the first preferred embodiment, the duplexer 10, which is mounted on the module board 2, preferably includes the cover layer 13 stacked on the insulating layer 12 that is disposed on the one principal surface 11a of the device board 11 so as to enclose the predetermined area thereof. The transmission filter device 14 and the reception filter device 15, which have different transmission bands, are provided on the one principal surface 11a of the device board 11 in the predetermined area thereof within the space enclosed by the insulating layer 12 between the device board 11 and the cover layer 13.

Accordingly, the duplexer 10 does not include a package board as in the existing technique, and in turn the circuit module 1, which includes the duplexer 10 mounted on the module board 2, is further reduced in height and in size.

To date, circuit elements such as the coil 16a, which defines the resonator 16 connected to the transmission filter device 14, and the chip coil 3a, which defines the matching circuit connected to the common terminal 17c of the transmission filter device 14 and the reception filter device 15, are provided on a package board included in the duplexer 10. In the first preferred embodiment, however, the coil 16a and the chip coil 3a are separately disposed in the cover layer 13 of the duplexer 10 and on the module board 2, respectively. Thus, without using a large-sized duplexer 10 including a package board having a large area, the coil 16a and the chip coil 3a are disposed so as to be spaced apart from each other, and thus the coil 16a and the chip coil 3a are reliably prevented from experiencing electromagnetic coupling or the like and from thus interfering with each other.

Here, the coil 16a has a relatively small inductance value as compared to the chip coil 3a, which defines the matching circuit 3, and parasitic inductance that is parasitic in the wiring patterns 5 has a large influence on the transmission filter device 14. Such a coil 16a is provided in the cover layer 13 of the duplexer 10, and thus the transmission filter device 14 and the coil 16a are disposed in close proximity to each other. Accordingly, influence on the transmission filter device 14 caused by parasitic inductance that occurs in the wiring patterns 5 between the coil 16a and the transmission filter device 14 is reliably prevented, making the above configuration practical.

The chip coil 3a, which has a greater inductance value than the coil 16a that defines the resonator 16 and which defines the matching circuit 3, is provided on the module board 2, which has more room for circuit elements to be disposed than the cover layer 13 of the duplexer 10, and thus the design flexibility of the circuit module 1 is increased.

In other words, the matching circuit 3, which is defined by the chip coil 3a mounted on the component side 2a of the module board 2, is connected to the output side of the transmission filter device 14 and the input side of the reception filter device 15. The chip coil 3a, however, is provided on the module board 2, which has room for the circuit elements to be disposed, and thus the matching circuit 3 having a practical configuration is provided in the circuit element 1 with ease, for example, by providing the chip coil 3a having a large inductance value. In addition, modifications to the design of the circuit module 1 are easily realized by replacing a chip component such as the chip coil 3a.

The shield electrode 4, which is disposed between the duplexer 10 and the chip coil 3a, is provided on the module board 2, and thus the chip coil 3a and the transmission filter device 14, the reception filter device 15, or the coil 16a are reliably prevented from experiencing magnetic field coupling or capacitive coupling and from thus interfering with each other.

The coil 16a is preferably defined by a circuit pattern within the cover layer 13. Here, forming a minimum required number of electrode patterns, which are connected to the transmission filter 14, in the cover layer 13 makes it possible to prevent the thickness of the cover layer 13 from increasing. As the coil 16a is provided in the cover layer 13, the duplexer 10 is not increased in height, making the above configuration very practical.

The device board 11 is preferably made of a piezoelectric material, and the transmission filter device 14 and the reception filter device 15 are the SAW filter devices, which include the interdigital electrodes 14a and 15a provided on the one principal surface 11a of the piezoelectric material in the predetermined area thereof. The resonator 16 that adjusts the attenuation characteristics of the SAW filter is connected to the transmission filter device 14, and thus the attenuation characteristics of the transmission filter device 14 are improved. Typically, as compared to the chip coil 3a for the matching circuit 3, the coil 16a, which defines the resonator 16 that adjusts the attenuation characteristics of the SAW filter device, may have a small inductance value. Thus, even if the coil 16a is provided in the cover layer 13 of the duplexer 10, the duplexer 10 is not increased in size, making the above configuration practical.

In the first preferred embodiment, in order to arrange the matching circuit 3 to be connected to the transmission filter device 14 and the reception filter device 15, the chip coil 3a preferably is mounted on the component side 2a of the module board 2. Alternatively, in addition to the chip coil 3a or in place of the chip coil 3a, chip components such as a chip resistor and a chip capacitor may be mounted on the component side 2a in accordance with the configuration of the circuit to be connected to the transmission filter device 14 or the reception filter device 15.

In the first preferred embodiment, in order to arrange the resonator 16 to be connected to the transmission filter device 14, the coil 16a preferably is provided in the cover layer 13 of the duplexer 10. Alternatively, in addition to the coil 16a or in place of the coil 16a, a circuit pattern that defines a resistor or a capacitor may be provided in the cover layer 13 in accordance with the configuration of the circuit to be connected to the transmission filter device 14 or the reception filter device 15. In addition, circuit elements such as the chip components to be connected to the transmission filter device 14 or the reception filter device 15 may be provided in the cover layer 13 of the duplexer 10.

Second Preferred Embodiment

A second preferred embodiment of the present invention will now be described with reference to FIG. 3. FIG. 3 is a diagram illustrating the second preferred embodiment of the circuit module of the present invention.

As illustrated in FIG. 3, the second preferred embodiment differs from the first preferred embodiment described above in that a coil 103a that defines the matching circuit 3 includes a circuit pattern provided in the module board 2. Other configurations are similar to the configurations in the first preferred embodiment described above and are thus given identical reference characters, and descriptions thereof will be omitted.

As illustrated in FIG. 3, the coil 103a, which defines the matching circuit 3, is provided in the module board 2. In addition, the duplexer 10 and the coil 103a are disposed respectively over and in the module board 2 so as to overlap when viewed from above, but the coil 16a provided in the cover layer 13 and the coil 103a provided in the module board 2 are disposed so as not to overlap when viewed from above.

With such a configuration, an effect similar to that of the first preferred embodiment described above is obtained, and the following effect is additionally obtained. That is to say, as the coil 103a, which defines the matching circuit 3, is defined by the circuit pattern provided in the module board 2, a chip component such as the chip coil 3a does not need to be mounted on the module board 2, and thus the circuit module 1 is significantly reduced in size.

In addition, as the duplexer 10 and the coil 103a are disposed so as to overlap when viewed from above, the coil 103a is disposed underneath the mounting location of the duplexer 10 so as to reduce the module board 2 in size, and thus the circuit module 1 is significantly reduced in size. Here, the coils 16a and 103a are disposed so as not to overlap when viewed from above, and thus the coils 16a and 103a are reliably prevented from experiencing magnetic field coupling or capacitive coupling and from thus interfering with each other. Accordingly, the transmission filter device 14 and the reception filter device 15 are also reliably prevented from interfering with each other, and thus isolation between the transmission and reception filters is significantly improved.

The shield electrode 4 is disposed between the coil 16a provided in the cover layer 13 and the coil 103a provided in the module board 2, and thus the coil 103a and the coil 16a, the transmission filter device 14, or the reception filter device 15 are reliably prevented from experiencing magnetic field coupling or capacitive coupling and from thus interfering with each other. The shield electrode 4 may be connected to a ground electrode provided on the module board 2 or on a rear surface of the module board 2 that is opposite to the component side 2a.

In the second preferred embodiment, in order to arrange the matching circuit 3 to be connected to the transmission filter device 14 and the reception filter device 15, the coil 103a preferably is provided in the module board 2. Alternatively, in addition to the coil 103a or in place of the coil 103a, a circuit pattern that defines a resistor or a capacitor may be provided in the module board 2 in accordance with the configuration of the circuit to be connected to the transmission filter device 14 or the reception filter device 15.

Third Preferred Embodiment

A third preferred embodiment of the present invention will now be described with reference to FIG. 4. FIG. 4 is a diagram illustrating the third preferred embodiment of the circuit module of the present invention.

As illustrated in FIG. 4, the third preferred embodiment differs from the first preferred embodiment described above in that the coil 103a is provided in the module board 2, and the matching circuit 3 is defined by the chip coil 3a and the coil 103a. In addition, the chip coil 3a and the coil 103a are disposed so as to overlap when viewed from above. Other configurations are similar to the configurations in the first preferred embodiment described above and are thus given identical reference characters, and descriptions thereof will be omitted.

With such a configuration, an effect similar to that of the first preferred embodiment described above is obtained, and the following effect is additionally obtained. That is to say, providing the matching circuit 3 by combining the chip coil 3a and the coil 103a makes it possible to reduce the chip coil 3a in size. In addition, disposing the chip coil 3a and the coil 103a so as to overlap when viewed from above makes it possible to reduce the area in the circuit module 1 which is occupied by the chip coil 3a and the coil 103a, enabling the circuit module 1 to be reduced in size.

In the third preferred embodiment, the matching circuit 3 is defined by the chip coil 3a and the coil 103a provided in the module board 2. Alternatively, the coil 103a may be provided in the module board 2 independently from the chip coil 3a, and thus a circuit, which is distinct from the matching circuit 3, to be connected to the transmission filter device 14 or the reception filter device 15 may be defined by the coil 103a. In addition, in addition to the coil 103a or in place of the coil 103a, a circuit pattern that defines a resistor or a capacitor may be provided in the module board 2 in accordance with the configuration of the circuit to be connected to the transmission filter device 14 or the reception filter device 15.

Fourth Preferred Embodiment

A fourth preferred embodiment of the present invention will now be described with reference to FIG. 5. FIG. 5 is a diagram illustrating the fourth preferred embodiment of the circuit module of the present invention.

As illustrated in FIG. 5, the fourth preferred embodiment differs from the second preferred embodiment described above in that the coil 16a provided in the cover layer 13 and the coil 103a provided in the module board 2 are disposed immediately underneath the transmission filter device 14 and are connected to the transmission filter device 14. Other configurations are similar to the configurations in the first and second preferred embodiments described above and are thus given identical reference characters, and descriptions thereof will be omitted.

With such a configuration, an effect similar to that of the first preferred embodiment described above is obtained, and the following effect is additionally obtained. That is to say, the coil 16*a* provided in the cover layer 13 and the coil 103*a* provided in the module board 2 are disposed immediately underneath the transmission filter device 14 and are connected to the transmission filter device 14. Thus, a signal that propagates through the transmission filter device 14 is reliably prevented from leaking into the reception filter device 15, and isolation characteristics of the transmission filter device 14 and the reception filter device 15 are improved.

It should be noted that the present invention is not limited to the preferred embodiments described above, and various modifications can be made, aside from those described above, without departing from the spirit of the present invention. For example, in the preferred embodiments described above, the first filter device of the present invention is preferably defined by the transmission filter device 14, and the second filter device of the present invention is preferably defined by the reception filter device 15. Alternatively, the first and second filter devices may be preferably defined by the reception filter device 15 and the transmission filter device 14, respectively.

The shield electrode 4 described above does not necessarily have to be provided. By disposing the first circuit element and the second circuit element so as to be sufficiently spaced apart from each other as compared to the exiting technique, the first circuit element and the second circuit element are reliably prevented from experiencing magnetic field coupling or capacitive coupling and from thus interfering with each other.

In the preferred embodiments described above, the circuit module in which the single duplexer preferably is mounted on the module board is illustrated as an example. Alternatively, a circuit module may be provided by mounting two or more duplexers on a module board, for example. In such a case, a switch IC may be mounted on the module board, and a duplexer to be used may be selectively switched with the switch IC, among the plurality of duplexers mounted on the module board. In addition, in the preferred embodiments described above, the first and second filter devices preferably are disposed within the same space. Alternatively, two spaces that are each enclosed by the insulating layer between the device board and the cover layer may be provided, and the first and second filter devices may be disposed in the two spaces, respectively.

In the preferred embodiments described above, the duplexer having the WL-CSP that integrally includes the first and second filter devices is illustrated as an example. Alternatively, a duplexer may be provided by a plurality of device boards, cover layers, and insulating layers. In such a case, two devices, namely a device having the WL-CSP structure in which the first filter device is disposed in the space enclosed by the insulating layer between the device board and the cover layer and another device having the WL-CSP structure in which the second filter device is disposed in the space enclosed by the insulating layer between the device board and the cover layer, may be prepared, and these two devices may be mounted on the module board to define the duplexer of a preferred embodiment of the present invention.

Preferred embodiments of the present invention can broadly be applied to a circuit module that includes a duplexer including a first filter device and a second filter device that have different transmission bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module, comprising:
    a device board;
    an insulating layer arranged on one principal surface of the device board so as to enclose a predetermined area thereof;
    a cover layer stacked on the insulating layer so as to provide a space enclosed by the insulating layer between the cover layer and the device board;
    a duplexer including a first filter device and a second filter device, the first and second filter devices having different transmission bands, and the first and second filter devices being provided in the predetermined area within the space;
    a module board, on which the duplexer is mounted;
    a first circuit element provided in the cover layer, the first circuit element being connected to the first filter device or the second filter device;
    a second circuit element provided in or on the module board, the second circuit element being connected to the first filter device or the second filter device; and
    the cover layer includes a plurality of a resin layers stacked on each other, and an electrode pattern defining the first circuit element provided on each of the plurality of the resin layers.

2. The circuit module according to claim 1, wherein the first circuit element is defined by a first coil provided in the cover layer and the second circuit element is defined by a second coil provided in the module board, and the first and second coils are disposed immediately underneath one of the first filter device and the second filter device.

3. The circuit module according to claim 1, wherein the second circuit element includes a chip component mounted on a component side of the module board.

4. The circuit module according to claim 3, wherein
    the second circuit element further includes a circuit pattern provided in the module board; and
    the chip component and the circuit pattern are disposed so as to overlap when viewed from above.

5. The circuit module according to claim 1, wherein the second circuit element includes a circuit pattern provided in the module board.

6. The circuit module according to claim 5, wherein the duplexer and the circuit pattern are disposed so as to overlap when viewed from above.

7. The circuit module according to claim 5, wherein a shield electrode that is provided between the duplexer and the second circuit element is provided on the module board.

8. The circuit module according to claim 1, wherein the first and second circuit elements are disposed so as not to overlap when viewed from above.

9. The circuit module according to claim 5, wherein the first and second circuit elements are disposed immediately underneath the first filter device and connected to the first filter device.

10. The circuit module according to claim 1, wherein the first circuit element includes a circuit pattern provided in the cover layer.

11. The circuit module according to claim 1, wherein
    the device board includes a piezoelectric material;
    the first and second filter devices are SAW filter devices including an interdigital electrode provided in the predetermined area; and the first circuit element is a resonator that adjusts attenuation characteristics of a filter, and the resonator including a coil.

12. The circuit module according to claim 1, wherein
the second circuit element defines a matching circuit; and
the second circuit element is connected to an input side or an output side of each of the first and second filter devices.

13. The circuit module according to claim 1, wherein the module board is a ceramic multilayer body.

14. The circuit module according to claim 1, wherein the duplexer has a wafer level chip size package structure.

15. The circuit module according to claim 1, wherein the circuit module is a high frequency switch module.

16. The circuit module according to claim 1, wherein the first and second filter devices are SAW filter devices or BAW filter devices.

17. The circuit module according to claim 1, wherein the second circuit element defines a matching circuit and includes a circuit pattern provided in the module board.

18. The circuit module according to claim 1, wherein the second circuit element defines a matching circuit that includes a coil provided in the module board and a chip coil arranged to overlap the coil.

19. A communication terminal comprising the circuit module according to claim 1.

20. The communication terminal according to claim 19, wherein the communication terminal is a cellular phone or portable information terminal.

* * * * *